United States Patent
Duggal et al.

(10) Patent No.: US 9,871,154 B2
(45) Date of Patent: Jan. 16, 2018

(54) PHOTOVOLTAIC DEVICES

(71) Applicant: First Solar, Inc., Tempe, AZ (US)

(72) Inventors: Anil Raj Duggal, Niskayuna, NY (US); Joseph John Shiang, Niskayuna, NY (US); William Hullinger Huber, Niskayuna, NY (US); Adam Fraser Halverson, Albany, NY (US)

(73) Assignee: First Solar, Inc., Tempe, AZ (US)

( * ) Notice: Subject to any disclaimer, the term of this patent is extended or adjusted under 35 U.S.C. 154(b) by 541 days.

(21) Appl. No.: 13/923,644

(22) Filed: Jun. 21, 2013

(65) Prior Publication Data

US 2014/0373908 A1    Dec. 25, 2014

(51) Int. Cl.
*H01L 31/0272* (2006.01)
*H01L 31/0296* (2006.01)
*H01L 31/065* (2012.01)
*H01L 31/073* (2012.01)
*H01L 31/18* (2006.01)

(52) U.S. Cl.
CPC .... *H01L 31/0272* (2013.01); *H01L 31/02966* (2013.01); *H01L 31/065* (2013.01); *H01L 31/073* (2013.01); *H01L 31/1832* (2013.01); *Y02E 10/543* (2013.01)

(58) Field of Classification Search
CPC ........... H01L 31/0272; H01L 31/02966; H01L 31/065
See application file for complete search history.

(56) References Cited

U.S. PATENT DOCUMENTS

| | | | |
|---|---|---|---|
| 3,496,024 | A | 2/1970 | Ruehrwein |
| 4,388,483 | A | 6/1983 | Basol et al. |
| 4,568,792 | A | 2/1986 | Mooney et al. |
| 4,614,891 | A | 9/1986 | Kuwahata et al. |
| 5,578,502 | A | 11/1996 | Albright et al. |
| 6,537,845 | B1 | 3/2003 | McCandless et al. |
| 7,858,872 | B2 | 12/2010 | Hotz et al. |
| 8,198,117 | B2 | 6/2012 | Leidholm et al. |
| 8,309,387 | B2 | 11/2012 | Forehand |

(Continued)

FOREIGN PATENT DOCUMENTS

| | | |
|---|---|---|
| CN | 101615638 A | 12/2009 |
| CN | 101779290 A | 7/2010 |

(Continued)

OTHER PUBLICATIONS

PCT International Search Report and Written Opinion, Application PCT/US14/43368, dated Oct. 31, 2014.

(Continued)

*Primary Examiner* — Shannon Gardner
(74) *Attorney, Agent, or Firm* — MacMillan, Sobanski & Todd, LLC

(57) ABSTRACT

A photovoltaic device is presented. The photovoltaic device includes a layer stack; and an absorber layer is disposed on the layer stack. The absorber layer includes cadmium, tellurium, and selenium. A semiconductor layer is further disposed on the absorber layer, wherein a valence band offset between the semiconductor layer and the absorber layer is less than about 1.3 electron Volts, and a band gap of the semiconductor layer is in a range from about 1.2 electron Volts to about 3.5 electron Volts.

24 Claims, 9 Drawing Sheets

(56) References Cited

U.S. PATENT DOCUMENTS

| | | | |
|---|---|---|---|
| 2005/0257824 A1* | 11/2005 | Maltby | H01L 31/02242 136/252 |
| 2009/0014055 A1 | 1/2009 | Beck et al. | |
| 2010/0032008 A1* | 2/2010 | Adekore | B82Y 20/00 136/255 |
| 2011/0024876 A1 | 2/2011 | Bower et al. | |
| 2011/0100447 A1 | 5/2011 | Korevaar et al. | |
| 2011/0247687 A1 | 10/2011 | Zhang et al. | |
| 2012/0090661 A1 | 4/2012 | Capps et al. | |
| 2012/0132256 A1 | 5/2012 | Sager | |
| 2012/0192948 A1 | 8/2012 | Basol | |
| 2012/0313200 A1 | 12/2012 | Jackrel et al. | |
| 2013/0068279 A1 | 3/2013 | Buller et al. | |
| 2013/0074912 A1 | 3/2013 | Walukiewicz et al. | |
| 2013/0081670 A1 | 4/2013 | Ashley et al. | |
| 2013/0087190 A1 | 4/2013 | Han et al. | |
| 2013/0087744 A1 | 4/2013 | Fujdala et al. | |
| 2014/0216550 A1* | 8/2014 | Damjanovic | H01L 31/02966 136/260 |

FOREIGN PATENT DOCUMENTS

| | | |
|---|---|---|
| CN | 101978101 A | 2/2011 |
| CN | 102074594 A | 5/2011 |
| CN | 102254966 A | 11/2011 |
| CN | 102244110 B | 9/2012 |
| EP | 0248953 A1 | 12/1987 |
| WO | 2008136872 A2 | 11/2008 |
| WO | 2011036458 A2 | 3/2011 |
| WO | 2011044382 A1 | 4/2011 |

OTHER PUBLICATIONS

Tanaka et al., "Zinc and Selenium Co-Doped CdTe Substrates Lattice Matched to HgCdTe", Journal of Crystal Growth, vol. 94, Issue 1, Jan. 1989, pp. 166-170.

Rioux et al.,"ZnTe: A potential interlayer to form low resistance back contacts in CdS/CdTe solar cells", Journal of Applied Physics. (1993); Jun. 15, 1993, vol. 73, No. 12, 8381, 6 Pages.

Burgelman et al., "Modelling polycrystalline semiconductor solar cells", Elsevier Science S.A., Thin Solid Films, 361-362 (2000), pp. 527-532.

Gloeckler et al., "Numerical Modeling of CIGS and CdTe Solar Cells:Setting the Baseline", 3rd World Conference on Photovoltaic Energy Conversion, May 11-18, 2003 Osaka, Japan, pp. 491-494.

Chinese First Office Action, Application No. CN 201480046223.X, dated Nov. 4, 2016.

Extended European Search Report, Application No. EP 14813176.6, dated Feb. 10, 2017.

Muthukumarasamy et al., "Photoconductive Properties of Hot Wall Deposited CdSe0.7Te0.3 Thin Films", Journal of New Materials for Electrochemical Systems, 2007, vol. 10, pp. 39-42.

Chinese Second Office Action, Application No. CN 201480046223. X, dated Jun. 12, 2017.

* cited by examiner

PHOTOVOLTAIC DEVICES

BACKGROUND

The invention generally relates to photovoltaic devices. More particularly, the invention relates to photovoltaic devices including selenium.

Thin film solar cells or photovoltaic (PV) devices typically include a plurality of semiconductor layers disposed on a transparent substrate, wherein one layer serves as a window layer and a second layer serves as an absorber layer. The window layer allows the penetration of solar radiation to the absorber layer, where the optical energy is converted to usable electrical energy. The window layer further functions to form a heterojunction (p-n junction) in combination with an absorber layer. Cadmium telluride/cadmium sulfide (CdTe/CdS) heterojunction-based photovoltaic cells are one such example of thin film solar cells, where CdS functions as the window layer.

However, thin film solar cells may have low conversion efficiencies. Thus, one of the main focuses in the field of photovoltaic devices is the improvement of conversion efficiency. Absorption of light by the window layer may be one of the phenomena limiting the conversion efficiency of a PV device. Further, a lattice mismatch between the window layer and absorber layer (e.g., CdS/CdTe) layer may lead to high defect density at the interface, which may further lead to shorter interface carrier lifetime. Thus, it is desirable to keep the window layer as thin as possible to help reduce optical losses by absorption. However, for most of the thin-film PV devices, if the window layer is too thin, a loss in performance can be observed due to low open circuit voltage ($V_{OC}$) and fill factor (FF). Low open circuit voltage and FF may also be due to a non-optimized back contact. In addition, some improvements that lead to increased short circuit current may have an adverse effect on open circuit voltage as well.

Thus, there is a need for improved thin film photovoltaic devices configurations, particularly those that simultaneously improve both open circuit current and voltage.

BRIEF DESCRIPTION OF THE INVENTION

Embodiments of the present invention are included to meet these and other needs. One embodiment is a photovoltaic device. The photovoltaic device includes a layer stack; and an absorber layer is disposed on the layer stack. The absorber layer includes cadmium, tellurium, and selenium. A semiconductor layer is further disposed on the absorber layer, wherein a valence band offset between the semiconductor layer and the absorber layer is less than about 1.3 electron Volts, and a band gap of the semiconductor layer is in a range from about 1.2 electron Volts to about 3.5 electron Volts.

One embodiment is a photovoltaic device. The photovoltaic device includes a layer stack and an absorber layer including $CdSe_zTe_{1-z}$ is disposed on the layer stack, wherein "z" is a number in a range from about 0 to about 1. A semiconductor layer is disposed directly in contact with the absorber layer, wherein a valence band offset between the absorber layer and the semiconductor layer is less than about 1.3 electron Volts, and a band gap of the semiconductor layer is in a range from about 1.6 electron Volts to about 2.7 electron Volts.

One embodiment is a photovoltaic device. The photovoltaic device includes a layer stack and an absorber layer including selenium is disposed on the layer stack, wherein a concentration of selenium varies across a thickness of the absorber layer. A semiconductor layer is disposed directly in contact with the absorber layer, wherein a valence band offset between the absorber layer and the semiconductor layer is less than about 0.45 electron Volts, and a band gap of the semiconductor layer is in a range from about 1.6 electron Volts to about 2.7 electron Volts.

DRAWINGS

These and other features, aspects, and advantages of the present invention will become better understood when the following detailed description is read with reference to the accompanying drawings, wherein.

DETAILED DESCRIPTION

Figure 1:
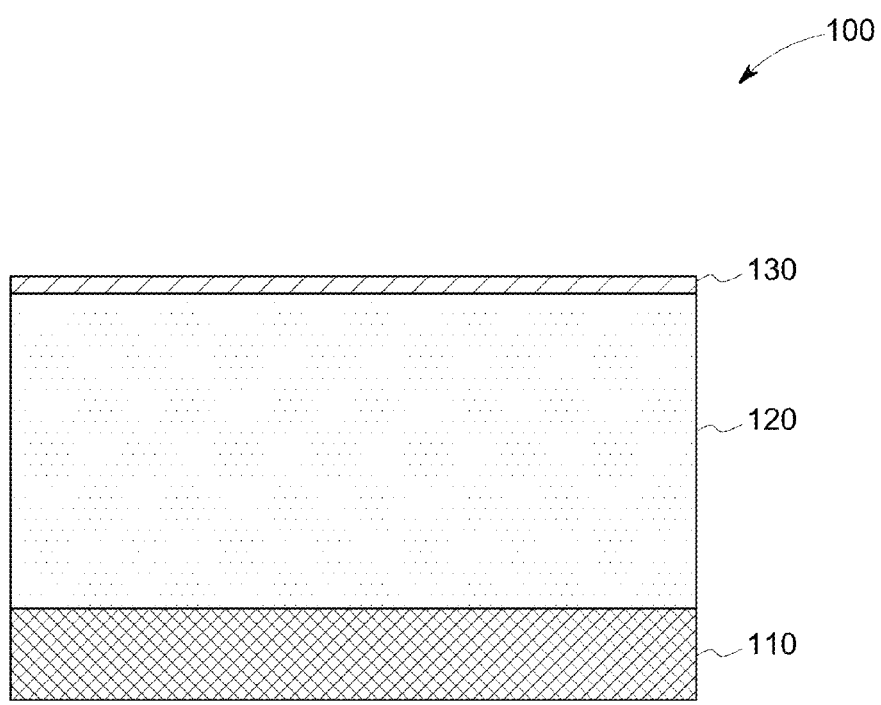
FIG. 1 is a schematic of a photovoltaic device, according to some embodiments of the invention.

As discussed in detail below, some of the embodiments of the invention include photovoltaic devices including selenium.

Approximating language, as used herein throughout the specification and claims, may be applied to modify any quantitative representation that could permissibly vary without resulting in a change in the basic function to which it is related. Accordingly, a value modified by a term or terms, such as "about", and "substantially" is not to be limited to the precise value specified. In some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

In the following specification and the claims, the singular forms "a", "an" and "the" include plural referents unless the context clearly dictates otherwise. As used herein, the term "or" is not meant to be exclusive and refers to at least one of the referenced components (for example, a layer) being present and includes instances in which a combination of the referenced components may be present, unless the context clearly dictates otherwise.

The terms "transparent region" and "transparent layer" as used herein, refer to a region or a layer that allows an average transmission of at least 70% of incident electromagnetic radiation having a wavelength in a range from about 350 nm to about 1000 nm.

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness. Furthermore, the term "a layer" as used herein refers to a single layer or a plurality of sub-layers, unless the context clearly dictates otherwise.

As used herein, the term "disposed on" refers to layers disposed directly in contact with each other or indirectly by having intervening layers therebetween, unless otherwise specifically indicated. The term "adjacent" as used herein means that the two layers are disposed contiguously and are in direct contact with each other.

In the present disclosure, when a layer is being described as "on" another layer or substrate, it is to be understood that the layers can either be directly contacting each other or have one (or more) layer or feature between the layers. Further, the term "on" describes the relative position of the layers to each other and does not necessarily mean "on top of" since the relative position above or below depends upon the orientation of the device to the viewer. Moreover, the use of "top," "bottom," "above," "below," and variations of these terms is made for convenience, and does not require any particular orientation of the components unless otherwise stated.

As discussed in detail below, some embodiments of the invention are directed to a photovoltaic device including selenium. A photovoltaic device 100, according to some embodiments of the invention, is illustrated in FIGS. 1-6. As shown in FIGS. 1-6, the photovoltaic device 100 includes a layer stack 110 and an absorber layer 120 disposed on the layer stack 110. The photovoltaic device further includes a semiconductor layer 130 disposed on the absorber layer 120.

The term "absorber layer" as used herein refers to a semiconducting layer wherein the solar radiation is absorbed, with a resultant generation of electron-hole pairs. In one embodiment, the absorber layer 120 includes a p-type semiconductor material.

Non-limiting examples of a suitable semiconductor material for forming the absorber layer 120 include cadmium telluride (CdTe), cadmium zinc telluride (CdZnTe), cadmium magnesium telluride (CdMgTe), cadmium manganese telluride (CdMnTe), cadmium sulfur telluride (CdSTe), mercury cadmium telluride (HgCdTe), or combinations thereof. As will be appreciated by one of ordinary skill in the art, the absorber layer 120 as described herein further includes selenium. Accordingly, the absorber layer 120 may further include a combination of one or more of the aforementioned semiconductor materials and selenium, such as, for example, cadmium selenide telluride, cadmium zinc selenide telluride, and the like. Further, these materials may be present in more than one layer, each layer having different type of semiconductor material, or having combinations of the materials in separate layers.

Selenium may be present in the absorber layer 120, in its elemental form, as a dopant, as a compound, or combinations thereof. In certain embodiments, at least a portion of selenium is present in the absorber layer in the form of a compound. The term "compound", as used herein, refers to a macroscopically homogeneous material (substance) consisting of atoms or ions of two or more different elements in definite proportions, and at definite lattice positions. For example, cadmium, tellurium, and selenium have defined lattice positions in the crystal structure of a cadmium selenide telluride compound, in contrast, for example, to selenium-doped cadmium telluride, where selenium may be a dopant that is substitutionally inserted on cadmium sites, and not a part of the compound lattice In some embodiments, at least a portion of selenium is present in the absorber layer 120 in the form of a ternary compound, a quaternary compound, or combinations thereof. In certain embodiments, at least a portion of selenium is present in the absorber layer 120 in the form of a compound having a formula $CdSe_zTe_{1-z}$, wherein "z" is a number greater than 0 and less than 1. In some embodiments, "z" is a number in a range from about 0.01 to about 0.99. As noted later, in some instances, the value of "z" varies across the thickness of the absorber layer 120.

The absorber layer 120 may be further characterized by the amount of selenium present. In some embodiments, an average atomic concentration of selenium in the absorber layer 120 is in a range from about 0.001 atomic percent to about 40 atomic percent of the absorber layer 120. In some embodiments, an average atomic concentration of selenium in the absorber layer 120 is in a range from about 0.01 atomic percent to about 25 atomic percent of the absorber layer 120. In some embodiments, an average atomic concentration of selenium in the absorber layer 120 is in a range from about 0.1 atomic percent to about 20 atomic percent of the absorber layer 120.

In some embodiments, at least a portion of the absorber layer 120 may further include sulfur, oxygen, copper, chlorine, lead, zinc, mercury, or combinations thereof. In certain embodiments, the absorber layer 120 may include one or more of the aforementioned materials, such that the amount of the material varies across a thickness of the absorber layer 120. In some embodiments, one or more of the aforementioned materials may be present in the absorber layer as a dopant. In certain embodiments, the absorber layer 120 further includes a copper dopant. In some embodiments, the absorber layer 120 may further include sulfur. In such instances, at least a portion of the selenium is present in the absorber layer 120 in the form of a quaternary compound including cadmium, tellurium, sulfur, and selenium.

In some embodiments, an atomic concentration of selenium is substantially constant across a thickness of the absorber layer. The term "substantially constant" as used in this context means that a change in atomic concentration of selenium across a thickness of the absorber layer 120 is less than about 5 percent. The term "atomic concentration" as used in this context herein refers to the average number of selenium atoms per unit volume of the absorber layer. The terms "atomic concentration" and "concentration" are used herein interchangeably throughout the text.

In some embodiments, an atomic concentration of selenium varies across a thickness of the absorber layer 120. The variation may be linear or non-linear. In certain embodiments, an atomic concentration of selenium varies non-linearly across a thickness of the absorber layer 120. The term "varies non-linearly across the thickness" as used herein means that the rate-of-change in concentration itself varies across the thickness of the absorber layer 120.

As used herein the term "linear gradient" refers to the first derivative of a given property, which when measured respect to a dimensional parameter, such as the distance from the front contact is both continuous and constant. For example, a step-wise distribution with a fixed concentration of selenium (Se) at the front contact, which then abruptly transitions to a different concentration after some distance away from the front contact, is non-linear due to the fact that the first derivative is non-continuous at the point where the concentration of Se transitions from one value to another. An exponentially varying distribution is another example of a non-linear distribution since the value of the first derivative continuously changes as a function of distance. The linearity of a given distribution may be readily assessed by plotting the logarithm of the measured property versus the logarithm of the dimensional parameter. A linear gradient implies that the data when plotted this manner can be fit to a line with a unity slope. A super-linear distribution will have a slope greater than unity and a sub-linear distribution will have a slope less than 1.

Measurement of a first derivative of a material property in a real material implies averaging of the material property over a defined dimension and length scale, since the atomic nature of real materials may lead to local discontinuities of the first derivative. The non-linear distributions of interest according to some embodiments of the invention are in the axis that goes from the front contact to the back contact, which will be referred to as the z-axis or z-dimension. Thus, to measure the non-linearity of the distribution of a property along the z-axis, it may be useful to average the measured properties over the orthogonal axes, x, y in order to minimize the effect of grain-boundaries and other local inhomogeneities on the measurement.

A lower limit for the averaging window is set by the polaron radius of the material which scales the typical "size" of a charge carrier within a real material:

$$r_p = \sqrt{\frac{h}{4\pi m\omega}}$$

where h is Planck's constant, m is the effective mass of the charge carrier, and w is the highest angular frequency of a typical vibration of the lattice, which is typically an optical phonon. In cadmium telluride (CdTe), the effective mass of the electron is about 0.1 $m_e$, where $m_e$ is the mass of an electron in free space and the phonon angular frequency is about $2.1 \times 10^{13}$. Thus, the calculated polaron radius is about 5 nm and a calculated polaron diameter is about 10 nm. Since proto-typical Gaussian or exponential wave functions have significant amplitude about 2-3 times their nominal characteristic size, then an estimate of the 'size' of charge carrier in CdTe based material is about 30 nm. A typical charge carrier in a CdTe type material will sample a 30 nm diameter sphere at any given time, and its behavior will to a large extent be determined by the average physical properties within this sphere. Thus, to determine the degree of non-linearity relevant to the performance of the photovoltaic cells in accordance with some embodiments of the invention, it may not be necessary to resolve non-linearities in the distribution of a given property or composition below a length scale of about 30 nm. An upper limit on the averaging required is set by the need to sample a sufficient number of points, i.e. 3, along the z axis so that the linearity of the distribution may be determined.

In some embodiments, there is a step-change in the concentration of selenium across the thickness of the absorber layer 120. In such instances, the selenium concentration may remain substantially constant for some portion of the thickness. The term "substantially constant" as used in this context means that the change in concentration is less than 5 percent across that portion of the thickness.

In some embodiments, the concentration of selenium varies continuously across the thickness of the absorber layer 120. Further, in such instances, the variation in the selenium concentration may be monotonic or non-monotonic. In certain embodiments, the concentration of selenium varies non-monotonically across a thickness of the absorber layer. In some instances, the rate-of-change in concentration may itself vary through the thickness, for example, increasing in some regions of the thickness, and decreasing in other regions of the thickness. A suitable selenium profile may include any higher order non-linear profile. Non-limiting examples of suitable selenium profiles include an exponential profile, a top-hat profile, a step-change profile, a square-wave profile, a power law profile (with exponent greater than 1 or less than 1), or combinations thereof. As will be appreciated by one of ordinary skill in the art, the profile of the selenium concentration may further vary after the processing steps, and the final device may include a diffused version of the profiles discussed here.

In some embodiments, the selenium concentration decreases across the thickness of the absorber layer 120, in a direction away from the layer stack 110. In some embodiments, the selenium concentration monotonically decreases across the thickness of the absorber layer 120, in a direction away from the layer stack 110. In some embodiments, the selenium concentration continuously decreases across a certain portion of the absorber layer 120 thickness, and is further substantially constant in some other portion of the absorber layer 120 thickness.

In certain embodiments, the absorber layer 120 includes a varying concentration of selenium such that there is a lower concentration of selenium near the front interface (interface closer to the layer stack 110) relative to the back interface (interface closer to the semiconductor layer 130). In certain embodiments, the absorber layer 120 includes a varying concentration of selenium such that there is higher concentration of selenium near the front interface (interface closer to the layer stack 110) relative to the back interface (interface closer to the semiconductor layer 130).

In certain embodiments, the band gap in the absorber layer 120 may vary across a thickness of the absorber layer 120. In some embodiments, the concentration of selenium may vary across the thickness of the absorber layer 120 such that the band gap near the front interface is lower than the band gap near the back interface.

Without being bound by any theory, it is believed that a higher concentration of selenium near the front interface relative to the back interface may further allow for a higher fraction of incident radiation to be absorbed in the absorber layer 120. Moreover, selenium may improve the passivation of grain boundaries and interfaces, which can be seen through higher bulk lifetime and reduced surface recombination. Further, the lower band gap material near the front interface may enhance efficiency through photon confinement.

Figure 2:
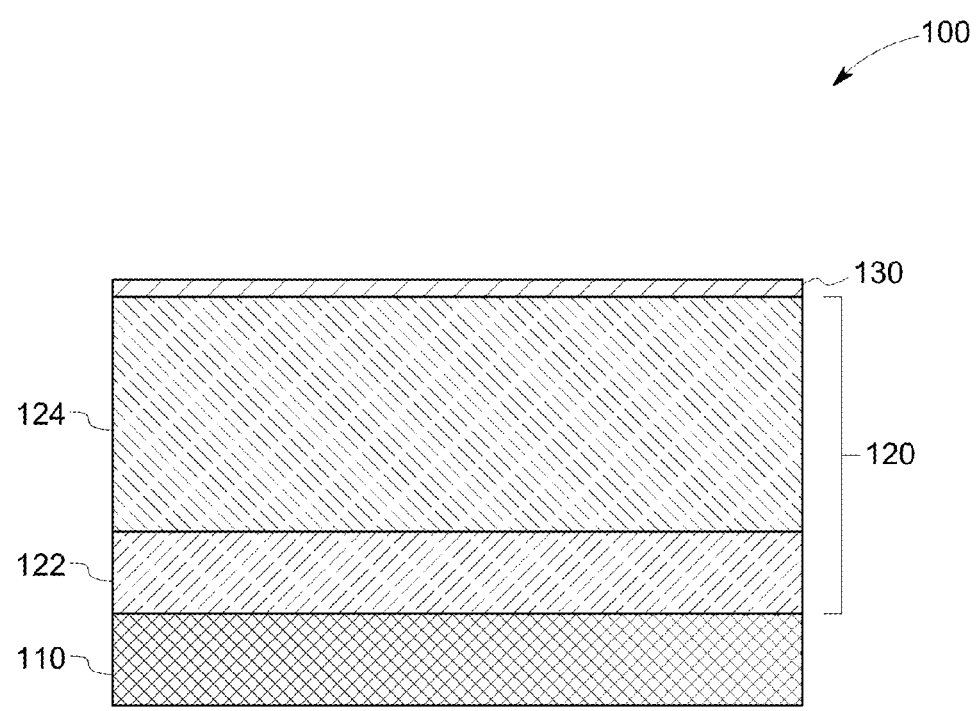
FIG. 2 is a schematic of a photovoltaic device, according to some embodiments of the invention.

In some embodiments, as indicated in FIG. 2, the absorber layer 120 includes a first region 122 and a second region 124. As illustrated in FIG. 2, the first region 122 is disposed proximate to the layer stack 110 relative to the second region 124. In some embodiments, an average atomic concentration of selenium in the first region 122 is greater than an average atomic concentration of selenium in the second region 124.

In some embodiments, the selenium concentration in the first region 122, the second region 124, or both the regions may further vary across the thickness of the respective regions. In some embodiments, the selenium concentration in the first region 122, the second region 124, or both the regions may continuously change across the thickness of the respective regions. As noted earlier, in some instances, the rate-of-rate-of-change in concentration may itself vary through the first region 122, the second region 124, or both the regions, for example, increasing in some portions, and decreasing in other portions.

In some embodiments, the selenium concentration in the first region 122, the second region 124, or both the regions may be substantially constant across the thickness of the respective regions. In some other embodiments, the selenium concentration may be substantially constant in at least a portion of the first region 122, the second region 124, or both the regions. The term "substantially constant" as used in this context means that the change in concentration is less than 5 percent across that portion or region.

The absorber layer 120 may be further characterized by the concentration of selenium present in the first region 122 relative to the second region 124. In some embodiments, a ratio of the average atomic concentration of selenium in the first region 122 to the average atomic concentration of selenium in the second region 124 is greater than about 2. In some embodiments, a ratio of the average atomic concentration of selenium in the first region 122 to the average atomic concentration of selenium in the second region 124 is greater than about 5. In some embodiments, a ratio of the average atomic concentration of selenium in the first region 122 to the average atomic concentration of selenium in the second region 124 is greater than about 10.

The first region 122 and the second region 124 may be further characterized by their thickness. In some embodiments, the first region 122 has a thickness in a range from about 1 nanometer to about 5000 nanometers. In some embodiments, the first region 122 has a thickness in a range from about 100 nanometers to about 3000 nanometers. In some embodiments, the first region 122 has a thickness in a range from about 200 nanometers to about 1000 nanometers. In some embodiments, the second region 124 has a thickness in a range from about 1 nanometer to about 5000 nanometers. In some embodiments, the second region 124 has a thickness in a range from about 100 nanometers to about 3000 nanometers. In some embodiments, the second region 124 has a thickness in a range from about 1000 nanometers to about 3000 nanometers.

Referring again to FIG. 2, in some embodiments, the first region 122 has a band gap that is lower than a band gap of the second region 124. In such instances, the concentration of selenium in the first region 122 relative to the second region 124 may be in a range such that the band gap of the first region 122 is lower than the band gap of the second region 124.

In certain embodiments, the second region 124 is substantially free of selenium. The term "substantially free" as used in this context means that the atomic concentration of selenium in the second region 124 is less than 1 percent. In certain embodiments, the second region 124 is completely free of selenium. In certain embodiments, the second region 124 includes cadmium telluride.

As noted earlier, a semiconductor layer 130 is disposed on the absorber layer 120. In some embodiments, the semiconductor layer 130 is interposed between the absorber layer 120 and the back contact layer 140. In some embodiments, an interfacial layer (e.g., less than 10 nanometers thick) (not shown) may be interposed between the semiconductor layer 130 and the absorber layer 120. The interfacial layer may be a simple transition layer between the two layers or could include other atoms that improve electrical, chemical or optical interface quality. In certain embodiments, the semiconductor layer 130 is disposed directly in contact with the absorber layer 120, as indicated in FIGS. 1-6.

A valence band offset between the semiconductor layer 130 and the absorber layer 120 is less than about 1.3 electron Volts, and a band gap of the semiconductor layer 130 is in a range from about 1.2 electron Volts to about 3.5 electron Volts. In some embodiments, a valence band offset between the semiconductor layer and the absorber layer is in a range from about −0.1 electron Volts to about 1.3 electron Volts. In some embodiments, a valence band offset between the semiconductor layer and the absorber layer is in a range from about 0 electron Volts to about 0.45 electron Volts.

The term "valence band offset" or "VBO" between the absorber layer 120 and the semiconductor layer 130 is defined by the formula:

$$VBO = E_{v\_abs} - E_a - E_g$$

wherein $E_{v\_abs}$ is the valence band energy level of the absorber layer 120 adjacent to the semiconductor layer 130 material, $E_a$ is the electron affinity and $E_g$ is the band gap of the semiconductor layer 130 material.

The valance band offset may be measured experimentally using photoelectron spectroscopies (such as, for example, ultraviolet photoelectron spectroscopy (UPS) or x-ray photoelectron spectroscopy (XPS)) of the absorber layer 120 material and the semiconductor layer 130 material. The bandgap of a material may be measured using optical spectroscopies such as UV-Vis-IR absorption or reflection spectroscopy or photoluminescence. In addition, temperature dependent capacitance-frequency measurements may be used on the fabricated devices and the VBO inferred from the observed back contact barrier as measured by the capacitance experiment.

In some embodiments, a band gap of the semiconductor layer 130 is in a range from about 1.2 electron Volts to about 3.5 electron Volts. In some embodiments, a band gap of the semiconductor layer 130 is in a range from about 1.6 electron Volts to about 2.7 electron Volts.

Without being bound by any theory, it is believed that if the valence band of the semiconductor layer 130 is close to the valence band of the absorber layer 120, there is minimal barrier to hole transport into the semiconductor layer 130. Further, it may be desirable that the semiconductor layer 130 has an offset in conduction band energy level relative to that of the absorber layer 120, such that the electrons encounter an energy barrier in moving from the absorber layer 120 to the semiconductor layer 130. Thus, the semiconductor layer 130 may function as an electron barrier layer, and the terms "semiconductor layer" and "electron barrier layer" are used herein interchangeably.

A conduction band offset may minimize or preclude unwanted recombination of electrons at the back contact, particularly, when the absorber layer is relatively thin (<3 microns). Reduced recombination at the back contact results in increased voltage generated at a given light intensity which results in a higher device efficiency.

Further, without being bound by any theory it is believed that a combination of an absorber layer including selenium and an electron blocking layer provides for a higher efficiency device through both increased current and increased voltage. The selenium enables higher current by decreasing the effective absorber bandgap. However, this typically comes at the cost of reduced operating voltage due to increased dark current. Adding the electron-blocking layer mitigates this effect, thereby enabling the reduced bandgap material to better approach its efficiency entitlement.

The semiconductor layer 130 may have a thickness in a range from about 1 nanometer to about 3000 nanometers in some embodiments, and in a range from about 1 nanometer to about 500 nanometers, in some other embodiments.

A suitable semiconductor layer 130 may include a semiconductor material having formula $Cd_xM_{1-x}Te$, wherein "x" is a number in a range from 0 to 1, Cd is cadmium, Te is tellurium, and M includes a divalent metal. In certain embodiments, M includes manganese, magnesium, zinc, or combinations thereof. In some embodiments, the semiconductor layer 130 includes $Cd_xMn_{1-x}Te$, $Cd_xZn_{1-x}Te$, $Cd_xMg_{1-x}Te$, or combinations thereof. In certain embodiments x is 0, and the semiconductor layer includes a material having a formula MTe, for example, zinc telluride. Suitable non-limiting examples of material for semiconductor layer 130 include zinc telluride, cadmium manganese telluride, or combinations thereof.

The semiconductor layer 130 may be substantially intrinsic in some embodiments, or, alternatively, may be p-doped. The term "substantially intrinsic" as used herein refers to a material with a carrier concentration of less than about $10^{13}$ per cubic centimeter (cc). As will be recognized by those skilled in the art, carrier concentrations in this range can be achieved for both actively doped material and material formed without the active introduction of dopants. In such instances, the back contact layer 140 may include a material that is suitable to facilitate hole extraction, such as, for example, copper-doped tellurium layer.

The term "p-doped" as used herein refers to a material with a carrier concentration in a range from about $1\times10^{13}$ per cubic centimeter (cc) to about $1\times10^{16}$ per cubic centimeter (cc). In embodiments wherein the semiconductor layer 130 is p-doped, the semiconductor layer 130 may include a suitable p-type dopant, such as, for example, copper, nitrogen, phosphorus, antimony, arsenic, sodium, or combinations thereof. In such instances, the semiconductor layer may itself act as a hole-extracting layer, and the back contact layer 140 may include a metal, graphite, or combinations thereof.

As noted, the absorber layer 120 is a component of a photovoltaic device 100. In some embodiments, the photovoltaic device 100 includes a "superstrate" configuration of layers. Referring now to FIGS. 3-6, in such embodiments, the layer stack 110 further includes a support 111, and a transparent conductive oxide layer 112 (sometimes referred to in the art as a front contact layer) is disposed on the support 111. As further illustrated in FIGS. 3-6, in such embodiments, the solar radiation 10 enters from the support 111, and after passing through the transparent conductive oxide layer 112, the buffer layer 113, and optional intervening layers (for example, interlayer 114 and window layer 115) enters the absorber layer 120. The conversion of electromagnetic energy of incident light (for instance, sunlight) to electron-hole pairs (that is, to free electrical charge) occurs primarily in the absorber layer 120.

In some embodiments, the support 111 is transparent over the range of wavelengths for which transmission through the support 111 is desired. In one embodiment, the support 111 may be transparent to visible light having a wavelength in a range from about 400 nm to about 1000 nm. In some embodiments, the support 111 includes a material capable of withstanding heat treatment temperatures greater than about 600° C., such as, for example, silica or borosilicate glass. In some other embodiments, the support 111 includes a material that has a softening temperature lower than 600° C., such as, for example, soda-lime glass or a polyimide. In some embodiments certain other layers may be disposed between the transparent conductive oxide layer 112 and the support 111, such as, for example, an anti-reflective layer or a bather layer (not shown).

The term "transparent conductive oxide layer" as used herein refers to a substantially transparent layer capable of functioning as a front current collector. In some embodiments, the transparent conductive oxide layer 112 includes a transparent conductive oxide (TCO). Non-limiting examples of transparent conductive oxides include cadmium tin oxide ($Cd_2SnO_4$ or CTO); indium tin oxide (ITO); fluorine-doped tin oxide (SnO:F or FTO); indium-doped cadmium-oxide; doped zinc oxide (ZnO), such as aluminum-doped zinc-oxide (ZnO:Al or AZO), indium-zinc oxide (IZO), and zinc tin oxide ($ZnSnO_x$); or combinations thereof. Depending on the specific TCO employed and on its sheet resistance, the thickness of the transparent conductive oxide layer 112 may be in a range of from about 50 nm to about 600 nm, in one embodiment.

The term "buffer layer" as used herein refers to a layer interposed between the transparent conductive oxide layer 112 and the absorber layer 120, wherein the layer 113 has a higher sheet resistance than the sheet resistance of the transparent conductive oxide layer 112. The buffer layer 113 is sometimes referred to in the art as a "high-resistivity transparent conductive oxide layer" or "HRT layer".

Non-limiting examples of suitable materials for the buffer layer 113 include tin dioxide ($SnO_2$), zinc tin oxide (zinc-stannate (ZTO)), zinc-doped tin oxide ($SnO_2$:Zn), zinc oxide (ZnO), indium oxide ($In_2O_3$), or combinations thereof. In some embodiments, the thickness of the buffer layer 113 is in a range from about 50 nm to about 200 nm.

Figure 4:
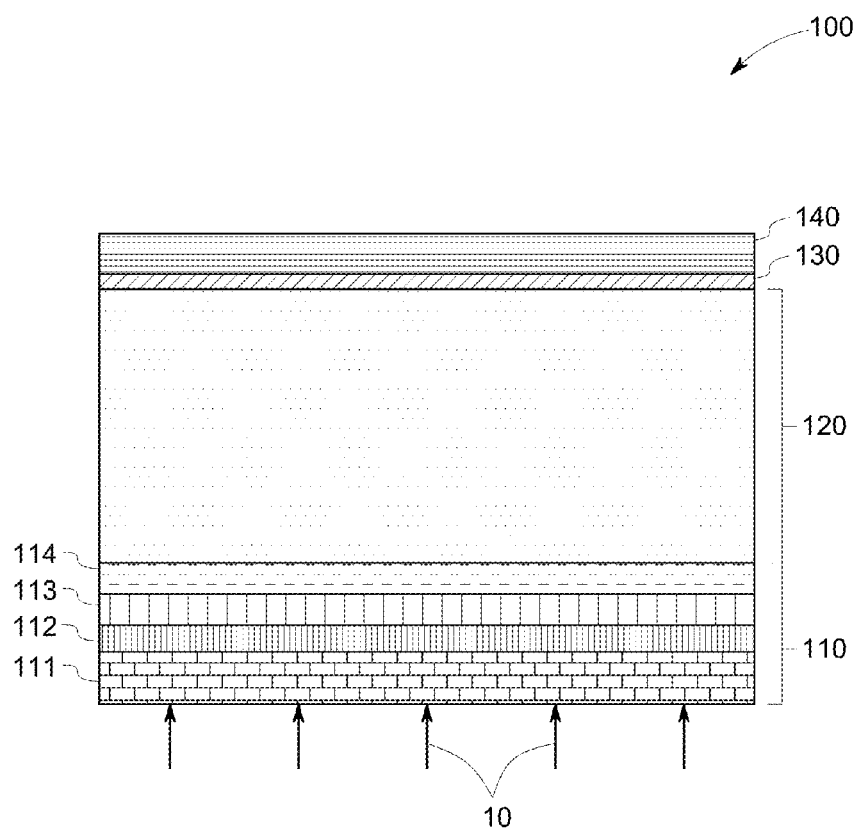
FIG. 4 is a schematic of a photovoltaic device, according to some embodiments of the invention.
Figure 5:
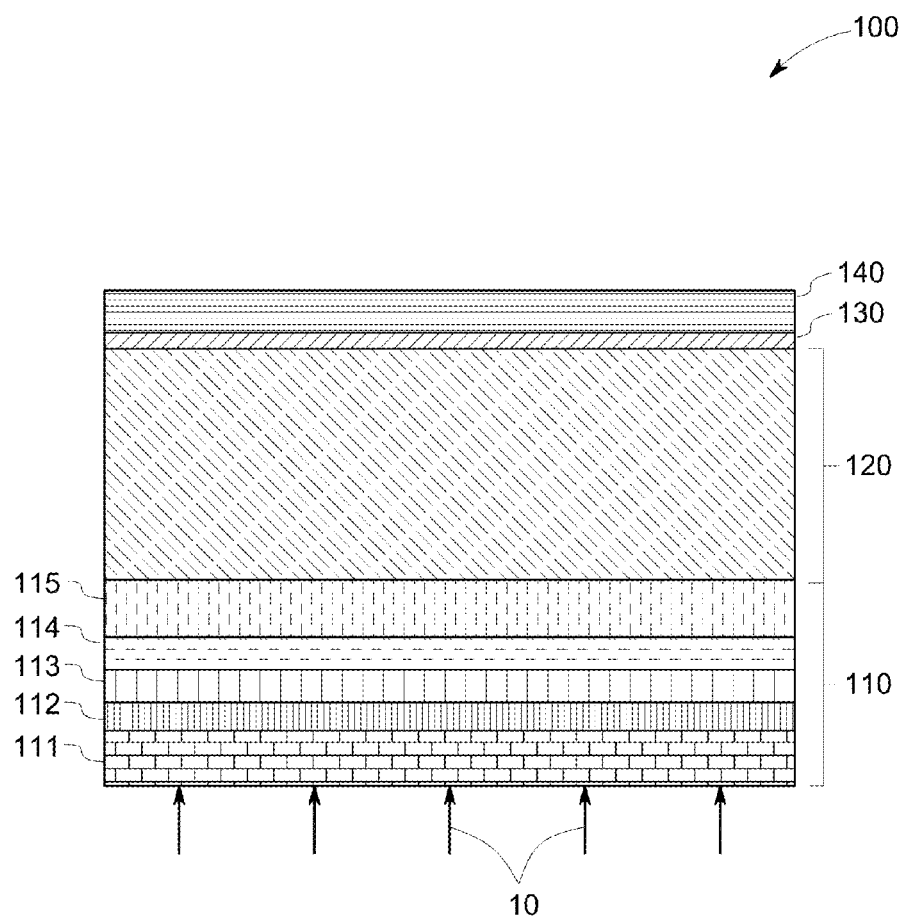
FIG. 5 is a schematic of a photovoltaic device, according to some embodiments of the invention.
Figure 6:
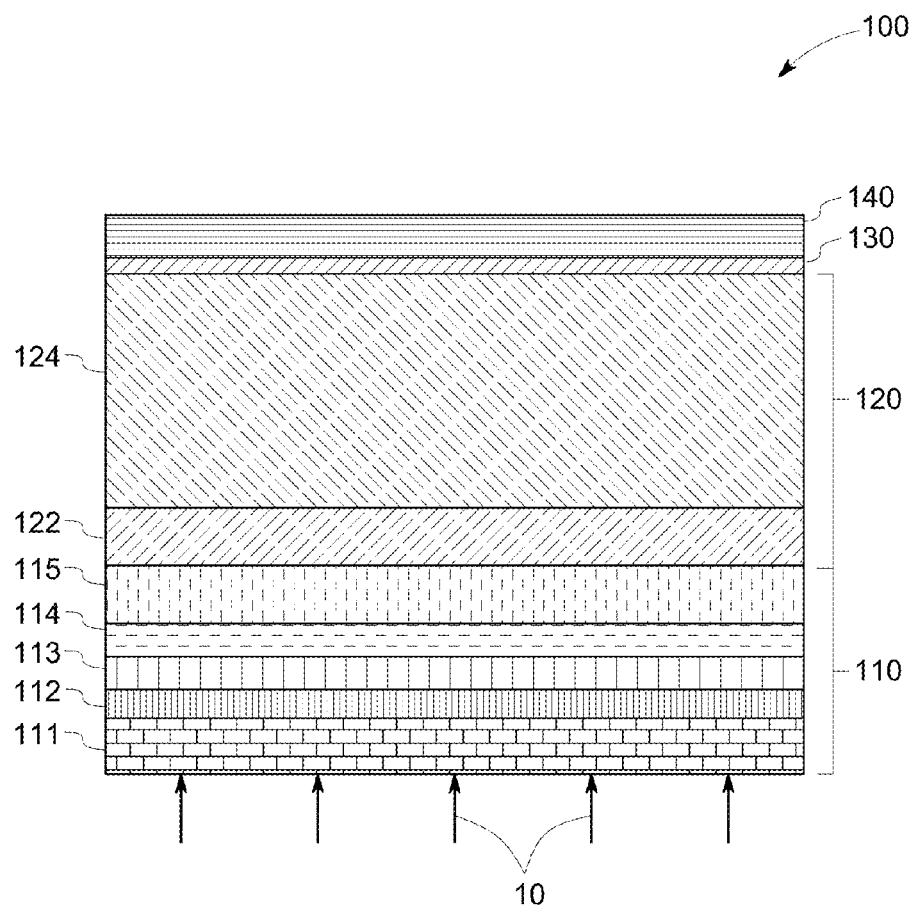
FIG. 6 is a schematic of a photovoltaic device, according to some embodiments of the invention.

In some embodiments, as indicated in FIGS. 4-6, the layer stack 110 may further include an interlayer 114 disposed between the buffer layer 113 and the absorber layer 120. The interlayer may include a metal species. Non limiting examples of metal species include magnesium, gadolinium, aluminum, beryllium, calcium, barium, strontium, scandium, yttrium, hafnium, cerium, lutetium, lanthanum, or combinations thereof. The term "metal species" as used in this context refers to elemental metal, metal ions, or combinations thereof. In some embodiments, the interlayer 114 may include a plurality of the metal species. In some embodiments, at least a portion of the metal species is present in the interlayer 114 in the form of an elemental metal, a metal alloy, a metal compound, or combinations thereof. In certain embodiments, the interlayer 114 includes magnesium, gadolinium, or combinations thereof.

In some embodiments, the interlayer 114 includes (i) a compound including magnesium and a metal species, wherein the metal species includes tin, indium, titanium, or combinations thereof; or (ii) a metal alloy including magnesium; or (iii) magnesium fluoride; or combinations thereof. In certain embodiments, the interlayer includes a compound including magnesium, tin, and oxygen. In certain embodiments, the interlayer includes a compound including magnesium, zinc, tin, and oxygen.

In some embodiments, the photovoltaic device 100 is substantially free of a cadmium sulfide layer. The term "substantially free of a cadmium sulfide layer" as used herein means that a percentage coverage of the cadmium sulfide layer (if present) on the underlying layer (for example, the interlayer or the buffer layer) is less than 20 percent. In some embodiments, the percentage coverage is in a range from about 0 percent to about 10 percent. In some embodiments, the percentage coverage is in a range from about 0 percent to about 5 percent. In certain embodiments, the photovoltaic device is completely free of the cadmium sulfide layer.

As will be appreciated by one of ordinary skill in the art, by varying the concentration of selenium in the absorber layer 120, a particular region of the absorber layer 120 may be rendered n-type and another region of the absorber layer 120 may be rendered p-type. In certain embodiments, the absorber layer 120 includes a "p-n" junction. The "p-n" junction may be formed between a plurality of regions of the absorber layer 120 having different band gaps. Without being bound by any theory, it is believed that the variation in selenium concentration may allow for a p-n junction within the absorber layer 120 or formation of a junction between the absorber layer and the underlying TCO layer.

Figure 3:
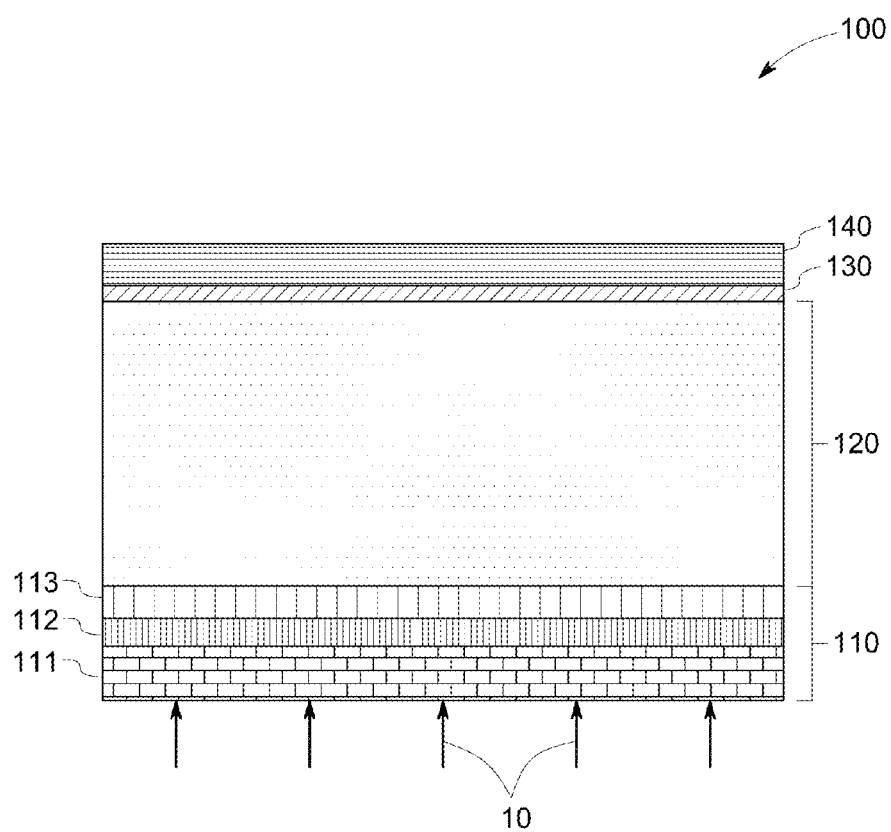
FIG. 3 is a schematic of a photovoltaic device, according to some embodiments of the invention.

As indicated in FIGS. 3 and 4, in certain embodiments, the absorber layer 120 is disposed directly in contact with the layer stack 110. However, as further noted earlier, in some embodiments, the photovoltaic device 100 may include a discontinuous cadmium sulfide layer interposed between the layer stack 110 and the absorber layer 120 (embodiment not shown). In such instances, the coverage of the CdS layer on the underlying layer (for example, interlayer 114 and the buffer layer 113) is less than about 20 percent. Further, at least a portion of the absorber layer 120 may contact the layer stack 110 through the discontinuous portions of the cadmium sulfide layer.

In some embodiments, the photovoltaic device may further include a window layer (including a material such as CdS). In some embodiments, the absorber layer 120 may form a p-n junction with the underlying buffer layer or the window layer. Referring now to FIGS. 5 and 6, in some embodiments, the layer stack 110 may further include a window layer 115 disposed between the interlayer 114 and the absorber layer 120. The term "window layer" as used herein refers to a semiconducting layer that is substantially transparent and forms a heterojunction with an absorber layer 120. Non-limiting exemplary materials for the window layer 115 include cadmium sulfide (CdS), indium III sulfide ($In_2S_3$), zinc sulfide (ZnS), zinc telluride (ZnTe), zinc selenide (ZnSe), cadmium selenide (CdSe), oxygenated cadmium sulfide (CdS:O), copper oxide ($Cu_2O$), zinc oxihydrate (ZnO:H), or combinations thereof. In certain embodiments, the window layer 115 include cadmium sulfide (CdS). In certain embodiments, the window layer 115 includes oxygenated cadmium sulfide (CdS:O).

In some embodiments, the absorber layer 120, the window layer 115, or both the layers may contain oxygen. Without being bound by any theory, it is believed that the introduction of oxygen to the window layer 115 (e.g., the CdS layer) may result in improved device performance. In some embodiments, the amount of oxygen is less than about 20 atomic percent. In some instances, the amount of oxygen is between about 1 atomic percent to about 10 atomic percent. In some instances, for example in the absorber layer 120, the amount of oxygen is less than about 1 atomic percent. Moreover, the oxygen concentration within the absorber layer 120 may be substantially constant or compositionally graded across the thickness of the respective layer.

The photovoltaic device 100 further includes a semiconductor layer 130, as discussed in detail earlier. In some embodiments, the photovoltaic device 100 further includes a back contact layer 140, as indicated in FIGS. 3-6. In some embodiments, the back contact layer includes a metal, copper-doped elemental tellurium, graphite, or combinations thereof. In certain embodiments, the back contact layer 140 includes gold, platinum, molybdenum, tungsten, tantalum, titanium, palladium, aluminum, chromium, nickel, silver, copper-doped elemental tellurium, graphite, or combinations thereof. The back contact layer 140 may include a plurality of layers that function together as the back contact.

In some embodiments, another metal layer (not shown), for example, aluminum, may be disposed on the back contact layer 140 to provide lateral conduction to the outside circuit. In certain embodiments, a plurality of metal layers (not shown), for example, aluminum and chromium, may be disposed on the back contact layer 140 to provide lateral conduction to the outside circuit. In certain embodiments, the back contact layer 140 may include a layer of carbon, such as, graphite deposited on the absorber layer 120, followed by one or more layers of metal, such as the metals described above.

Referring again to FIG. 6, as indicated, the absorber layer 120 further includes a first region 122 and a second region 124. As further illustrated in FIG. 6, the first region 122 is disposed proximate to the layer stack 110 relative to the second region 124. In some embodiments, the first region 122 is disposed directly in contact with the window layer 115. In some embodiments, the first region 122 is disposed directly in contact with the buffer layer 113 (embodiment not shown). Further, as discussed earlier, an average atomic concentration of selenium in the first region 122 is greater than an average atomic concentration of selenium in the second region 124. In other embodiments, an average atomic concentration of selenium in the first region 122 is lower than an average atomic concentration of selenium in the second region 124.

Figure 7:
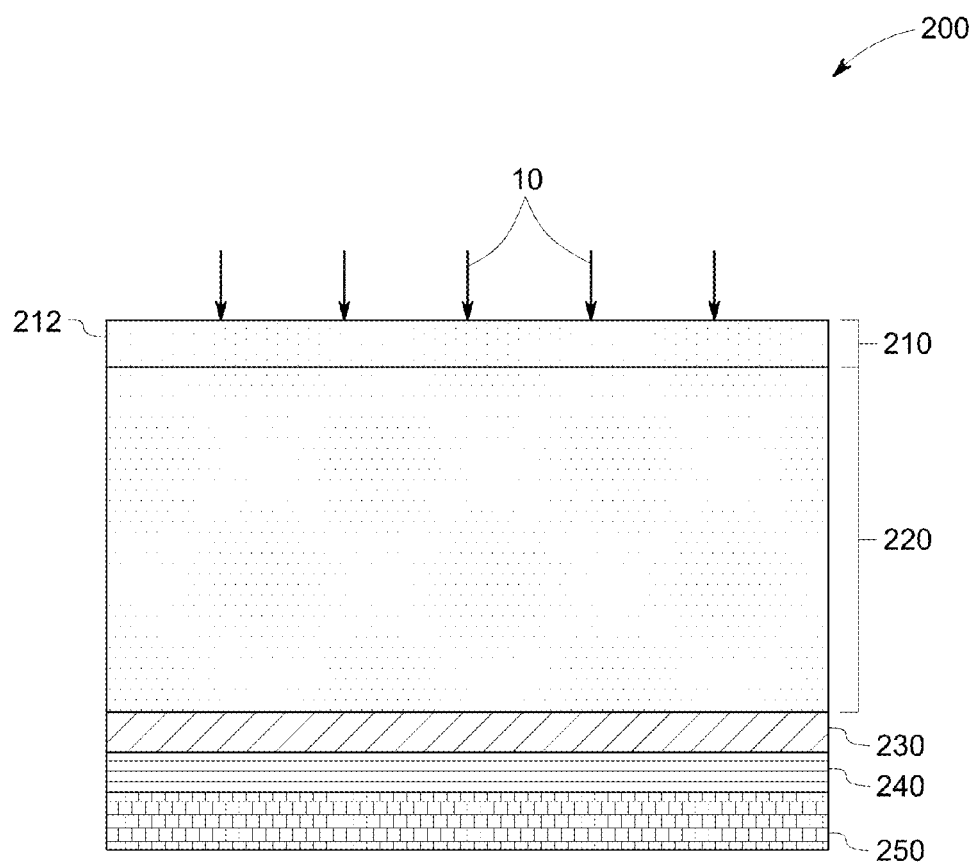
FIG. 7 is a schematic of a photovoltaic device, according to some embodiments of the invention.

In alternative embodiments, as illustrated in FIG. 7, a photovoltaic device 200 including a "substrate" configuration is presented. The photovoltaic device 200 includes a layer stack 210 and an absorber layer 220 disposed on the layer stack. The layer stack 210 includes a transparent conductive oxide layer 212 disposed on the absorber layer, as indicated in FIG. 7. The absorber layer 220 is further disposed directly in contact with the semiconductor layer 230, which is disposed on a back contact layer 240 disposed on a substrate 250. As illustrated in FIG. 7, in such embodiments, the solar radiation 10 enters from the transparent conductive oxide layer 212 and enters the absorber layer 220, where the conversion of electromagnetic energy of incident light (for instance, sunlight) to electron-hole pairs (that is, to free electrical charge) occurs.

In some embodiments, the composition of the layers illustrated in FIG. 7, such as, the substrate 240, the transparent conductive oxide layer 212, the absorber layer 220, the semiconductor layer 230, and the back contact layer 240 may have the same composition as described above in FIG. 5 for the superstrate configuration.

A method of making a photovoltaic device is also presented. In some embodiments, with continued reference to FIGS. 1-6, the method generally includes providing an absorber layer 120 on a layer stack 110, wherein the absorber layer 120 includes selenium. The method further includes disposing a semiconductor layer 130 directly in contact with the absorber layer 120.

In some embodiments, as indicated in FIG. 2, the step of providing an absorber layer 120 includes forming a first region 122 and a second region 124 in the absorber layer 120, the first region 122 disposed proximate to the layer stack 110 relative to the second region 124.

The absorber layer 120 may be provided on the layer stack 110 using any suitable technique. In some embodiments, the step of providing an absorber layer 120 includes contacting a semiconductor material with a selenium source. The terms "contacting" or "contacted" as used herein means that at least a portion of the semiconductor material is exposed to, such as, in direct physical contact with a suitable selenium source in a gas, liquid, or solid phase. In some embodiments, a surface of the absorber layer may be contacted with the suitable selenium source, for example using a surface treatment technique. In some other embodiments, the semiconductor material may be contacting with a suitable selenium source, for example, using a co-sublimation process.

In some embodiments, the semiconductor material includes cadmium and tellurium. Non-limiting examples of a suitable semiconductor material include cadmium telluride (CdTe), cadmium zinc telluride (CdZnTe), cadmium magnesium telluride (CdMgTe), cadmium manganese telluride (CdMnTe), cadmium sulfur telluride (CdSTe), mercury cadmium telluride (HgCdTe), or combinations thereof. In certain embodiments, the semiconductor material includes cadmium telluride (CdTe).

The term "selenium source" as used herein refers to any material including selenium. Non-limiting examples of a suitable selenium source include elemental selenium, cadmium selenide, oxides of cadmium selenide, such as, for example, cadmium selenite ($CdSeO_3$), hydrogen selenide, organo-metallic selenium, or combinations thereof.

The portion of the semiconductor material contacted with the selenium source may depend, in part, on the physical form of the selenium source during the contacting step. In some embodiments, the selenium source is in the form of a solid (for example, a layer, a powder, or a pellet), a solution, a suspension, a paste, vapor, or combinations thereof. Thus, by way of example, in some embodiments, for example, the selenium source may be in the form of a solution, and the method may include soaking at least a portion of the semiconductor material in the solution.

In some embodiments, the selenium source may be in the form a vapor, and the method may include depositing the selenium source using a suitable vapor deposition technique. In some embodiments, for example, the absorber layer 120 may be heat treated in the presence of a selenium source (for example, selenium vapor) to introduce selenium into at least a portion of the absorber layer 120.

In some embodiments, for example, the selenium source may be in the form of a layer, and the method may include depositing a selenium source layer on the semiconductor material, or, alternatively, depositing the semiconductor material on a layer of the selenium source. In some such embodiments, the method may further include subjecting the semiconductor material to one or more post-processing steps to introduce the selenium into the semiconductor material.

Figure 8:
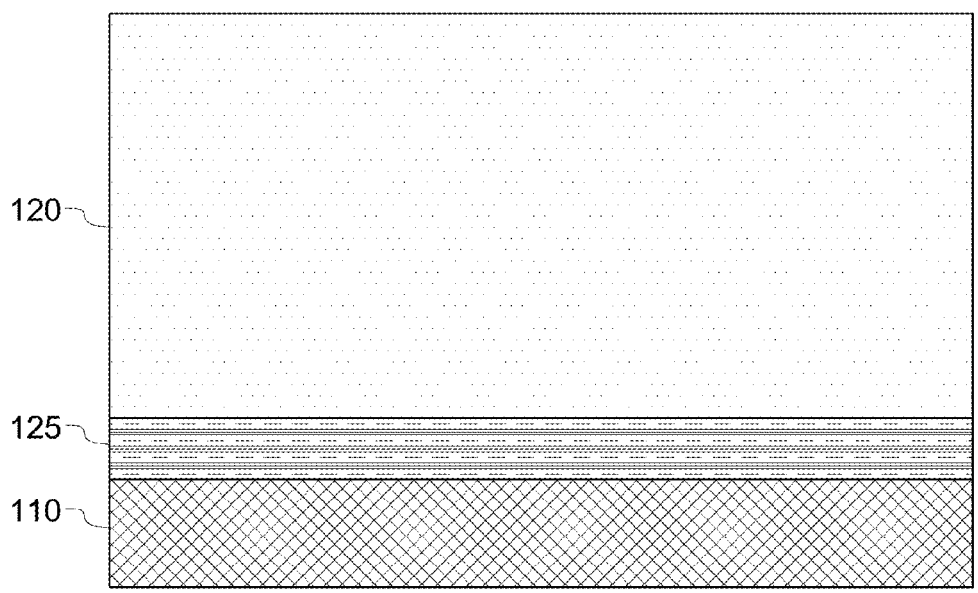
FIG. 8 is a schematic of a method step for making a photovoltaic device, according to some embodiments of the invention.

Referring now to FIG. 8, in some embodiments, the step of providing an absorber layer includes (a) disposing a selenium source layer 125 on the layer stack 110; (b) disposing an absorber layer 120 on the selenium source layer 125; and (c) introducing selenium into at least a portion of the absorber layer 120. It should be noted, that the steps (b) and (c) may be performed sequentially or simultaneously.

In some embodiments, the selenium source layer 125 may be disposed on the layer stack 110 using any suitable deposition technique, such as, for example, sputtering, sublimation, evaporation, or combinations thereof. The deposition technique may depend, in part, on one or more of the selenium source material, the selenium source layer 125 thickness, and the layer stack 110 composition. In certain embodiments, the selenium source layer 125 may include elemental selenium and the selenium source layer 125 may be formed by evaporation. In certain embodiments, the selenium source layer 125 may include cadmium selenide, and the selenium source layer 125 may be formed by sputtering, evaporation, or sublimation.

The selenium source layer may include a single selenium source layer or a plurality of selenium source layers. The selenium source may be the same or different in the plurality of source layers. In some embodiments, the selenium source layer includes a plurality of selenium source layers, such as, for example, a stack of elemental selenium layer and a cadmium selenide layer, or vice versa.

The selenium source layer 125 may have a thickness in a range from about 1 nanometer to about 1000 nanometers. In some embodiments, the selenium source layer 125 has a thickness in a range from about 10 nanometers to about 500 nanometers. In some embodiments, the selenium source layer 125 has a thickness in a range from about 15 nanometers to about 250 nanometers.

As noted, the method further includes disposing an absorber layer 120 on the selenium source layer 125. In some embodiments, the absorber layer 120 may be deposited using a suitable method, such as, close-space sublimation (CSS), vapor transport deposition (VTD), ion-assisted physical vapor deposition (IAPVD), radio frequency or pulsed magnetron sputtering (RFS or PMS), chemical vapor deposition (CVD), plasma enhanced chemical vapor deposition (PECVD), or electrochemical deposition (ECD).

The method further includes introducing selenium into at least a portion of the absorber layer 120. In some embodiments, at least a portion of selenium is introduced in the absorber layer 120 simultaneously with the step of disposing the absorber layer 120. In some embodiments, at least a portion of selenium may be introduced after the step of disposing the absorber layer 120, for example, during the cadmium chloride treatment step, during the semiconductor layer 130 formation step, during the back contact 140 formation step, or combinations thereof.

In some embodiments, the step of providing an absorber layer 120 includes co-depositing a selenium source material and a semiconductor material. Suitable non-limiting examples of co-deposition include co-sputtering, co-sublimation (for example, closed space sublimation), or combinations thereof. Non-limiting examples of a suitable selenium source material in such instance includes elemental selenium, cadmium selenide, hydrogen selenide, cadmium telluride selenide, or combinations thereof. Thus, by way of example, in some embodiments, an absorber layer 120 may be provided by depositing the semiconductor material in the presence of selenium source (for example, selenium containing vapor or hydrogen selenide vapor).

In some embodiments, the absorber layer 120 may be provided by sputtering from a single target (for example, cadmium selenide telluride target) or a plurality of targets (for example, cadmium telluride and cadmium selenide targets). As will be appreciated by one of ordinary skill in the art, the concentration of selenium in the absorber layer 120 may be varied by controlling one or both of target(s) composition and sputtering conditions.

As noted earlier, the photovoltaic device 100 and the layer stack 110 may further include one or more additional layers, for example, a support 111, a transparent conductive oxide layer 112, a buffer layer 113, an interlayer 114, a semiconductor layer 130, and a back contact layer 140, as depicted in FIGS. 3-6.

As understood by a person skilled in the art, the sequence of disposing the three layers or the whole device may depend on a desirable configuration, for example, "substrate" or "superstrate" configuration of the device.

In certain embodiments, a method for making a photovoltaic 100 in superstrate configuration is described. Referring now to FIGS. 3-6, in some embodiments, the method further includes disposing the transparent conductive oxide layer 112 on a support 111. The transparent conductive oxide layer 112 is disposed on the support 111 by any suitable technique, such as sputtering, chemical vapor deposition, spin coating, spray coating, or dip coating. Referring again to FIGS. 3-6, in some embodiments, a buffer layer 113 may be deposited on the transparent conductive oxide layer 112 using sputtering. The method may further including disposing an interlayer 114 on the buffer layer 113 to form a layer stack 110, as indicated in FIG. 4.

The method may further include disposing a window layer 115 on the interlayer 114 to form a layer stack 110, as indicated in FIGS. 5 and 6. Non-limiting examples of the deposition methods for the window layer 115 include one or more of close-space sublimation (CSS), vapor transport deposition (VTD), sputtering (for example, direct current pulse sputtering (DCP), electro-chemical deposition (ECD), and chemical bath deposition (CBD).

The method further includes providing an absorber layer 120 on the layer stack 110, as described in detail earlier. In some embodiments, a series of post-forming treatments may be further applied to the exposed surface of the absorber layer 120. These treatments may tailor the functionality of the absorber layer 120 and prepare its surface for subsequent adhesion to the back contact layer(s) 140. For example, the absorber layer 120 may be annealed at elevated temperatures for a sufficient time to create a quality p-type layer. Further, the absorber layer 120 may be treated with a passivating agent (e.g., cadmium chloride) and a tellurium-enriching agent (for example, iodine or an iodide) to form a tellurium-rich region in the absorber layer 120. Additionally, copper may be added to absorber layer 120 in order to obtain a low-resistance electrical contact between the absorber layer 120 and a back contact layer(s) 140.

Referring again to FIGS. 3-6, a semiconductor layer 130 may be further disposed on the absorber layer 120 using any suitable technique, for example PECVD or sputtering. In some embodiments, a back contact layer 140 (for example, a metal layer or a graphite layer) may be deposited on the semiconductor layer 130. A plurality of metal layers may be further deposited on the back contact layer 140. One or more of the absorber layer 120, the back contact layer 140, or the semiconductor 130 may be further heated or subsequently treated (for example, annealed) after deposition to manufacture the photovoltaic device 100.

In some embodiments, other components (not shown) may be included in the exemplary photovoltaic device 100, such as, buss bars, external wiring, laser etches, etc. For example, when the device 100 forms a photovoltaic cell of a photovoltaic module, a plurality of photovoltaic cells may be connected in series in order to achieve a desired voltage, such as through an electrical wiring connection. Each end of the series connected cells may be attached to a suitable conductor such as a wire or bus bar, to direct the generated current to convenient locations for connection to a device or other system using the generated current. In some embodiments, a laser may be used to scribe the deposited layers of the photovoltaic device 100 to divide the device into a plurality of series connected cells.

EXAMPLES

Comparative Examples 1-2 Simulation Tests for Photovoltaic Cells without the Electron Blocking Layer Simulations were carried out using the one-dimensional solar cell simulation program SCAPS v.3.2.01 (M. Burgelman, P. Nollet and S. Degrave, "Modelling polycrystalline semiconductor solar cells", Thin Solid Films 361-362 (2000), pp. 527-532). The program numerically solves the Poisson and continuity equations for electrons and holes in a single dimension to determine the band-diagram of the device and its response to illumination, voltage bias, and temperature. Performance calculations were made using simulated IV sweeps in the simulation under illumination by the AM1.5G spectrum at 100 mW/cm$^2$ of intensity and 300K, also known as Standard Test Conditions (STC). The model parameters for CdTe and the device design were set according to the parameters given by Gloeckler et. al. for CdTe solar cells. (M. Gloeckler, A. Fahrenbruch and J. Sites, "Numerical modeling of CIGS and CdTe solar cells: setting the baseline", Proc. 3rd World Conference on Photovoltaic Energy Conversion (Osaka, Japan, may 2003), pp. 491-494, WCPEC-3, Osaka (2003)), except that the CdTe absorber layer thickness was changed and the nature of the deep trap in the CdTe absorber layers was changed from 'donor' to neutral and the density reduced by a factor of ten. Note that the model parameters for CdTe specify a valence band energy level of 5.4 eV.

The CdSe parameters were set to have the same values as the CdTe parameters, except that the band gap was set to 1.7 eV and the electron affinity to 4.1 eV. A model for the variation in the properties of the alloy material $CdTe_{1-x}Se_x$ as a function of x, the faction Se substitution, was constructed. The model assumed that the band gap ($E_{g,CdTe}$) of the CdTe is equal to 1.5 eV, the band gap ($E_{g,CdSe}$) of the CdSe is equal to 1.7, and a bowing parameter, b=0.8. The band gap of the alloy ($E_{g,alloy}$) is given by:

$$E_{g,alloy} = xE_{g,CdSe} + (1-x)E_{g,CdTe} - bx(1-x)$$

The other material properties, such as carrier mobilities and dielectric constant values were assumed to be independent of alloy composition, and the deep donor concentration was assumed to vary linearly between the CdTe and CdSe values as function of x.

To further explore the nature of the invention additional simulations were performed. Two different Se concentration profiles were considered: a constant profile (Comparative Example 1) and a top-hat profile (Comparative Example 2). For the constant profile, a selenium (Se) concentration profile with x=0.4 was assumed throughout absorber layer. In the top-hat Se concentration profile, it was assumed that x=0 from the back of the device until about 0.5 microns from the front interface, whereupon it rises. From this point, it was assumed that x=0.4 until the front of the absorber layer is reached. The total absorber layer 120 thickness in both the cases was 3.5 microns.

Simulations to determine the anticipated benefits were performed under several different assumptions of the metal back contact workfunction (WF). Changing the value of the WF simulates the use of different materials to form the back contact to the photovoltaic cell. The value for the WF has units of energy and is typically measured in eV. As the back contact WF more closely matches the absorber material energy levels, then efficiency is improved. The effect of changing the metal work function in the absence of the electron blocking layer for different selenium profiles is illustrated in Table 1. The efficiencies reported in Table 1 were normalized to the calculated efficiency of a device with no Se in the absorber layer, and a back contact WF of 5.0 eV.

TABLE 1

Effect of metal work function on relative
efficiency of devices without an electron blocking layer

| Metal WF (eV) | Relative Efficiency Comparative Example 1 | Comparative Example 2 |
|---|---|---|
| 4.90 | 0.96 | 1.02 |
| 5.00 | 1.04 | 1.12 |
| 5.10 | 1.06 | 1.15 |
| 5.20 | 1.09 | 1.17 |
| 5.30 | 1.14 | 1.19 |
| 5.40 | 1.20 | 1.22 |

Examples 1-2 Simulation Tests for Photovoltaic Cells with the Electron Blocking Layer To simulate the effects of an electron blocking layer, the last 0.1 microns of the absorber layer was redefined as a blocking layer, and the VBO and Eg in this 0.1 micron layer was varied. Table 2 shows the calculated relative efficiency for four cases with and without an electron blocking layer with a VBO offset of 0 eV and an $E_g$ of 1.6 eV. The back contact work function was that of the original model from Gloeckler et. al. The baseline case is for a device of with CdTe absorber layer of 3.6 microns thickness with no EBL. This device is the reference device, and the relative efficiencies reported in Table 2 are ratios of the calculated device efficiency to the calculated efficiency of this reference device. To simulate the addition of a blocking layer the absorber layer thickness was reduced by 0.1 micron with an additional 0.1 micron electron blocking layer placed between the absorber layer and the back contact. Incorporation of this electron blocking layer onto a CdTe absorber layer that has no selenium results in a negligible improvement in efficiency. Use of selenium in the absorber layer with a constant profile, x=0.4 results in a modest improvement in efficiency. Use of the electron blocking layer and the Se composition results in a benefit that is distinctly greater than what could have been anticipated by multiplying the improvements from the charge blocking layer or the Se incorporation individually.

TABLE 2

Calculated relative efficiencies of photovoltaic
devices with and without an electron blocking layer (EBL)

| Device | Relative Efficiency |
|---|---|
| Baseline | 1.00 |
| Baseline + EBL | 1.00 |
| Constant Se | 1.04 |
| Constant Se + EBL | 1.10 |

To further explore the nature of the invention additional simulations were performed. To simulate the effects of an electron blocking layer, the last 0.1 microns of the absorber layer was redefined as a blocking layer that had a variable electron affinity ($E_a$) and band gap $E_g$, both measured in the units of eV. Following Gloeckler et. al, the $E_{v\_abs}$ was set to 5.4 eV. Using these quantities the valence band offset (VBO) between the absorber layer and the electron blocking layer was then defined as:

$$VBO = 5.4 \text{ eV} - E_a - E_g$$

The enhancement factor was calculated by calculating the ratio of the calculated efficiency of the device with the electron blocking layer (Examples 1 and 2) to the device with the same contact work function and Se profile without the electron blocking layer (Comparative Examples 1 and 2).

Table 3 shows the enhancement factors for different VBO and $E_g$ values for a variable Se profile and WF of 4.9 eV. Similar data was also collected for constant Se profile and WF=5.4 eV.

TABLE 3

Enhancement factors for different VBO and $E_g$
values for a variable Se profile and WF of 4.9 eV

| VBO (eV) | $E_a$ (eV) | $E_g$ (eV) | Enhancement factor |
|---|---|---|---|
| 1.3 | 2.1 | 2 | 0.20 |
| 1.1 | 2.1 | 2.2 | 0.38 |
| 0.9 | 2.1 | 2.4 | 0.58 |
| 1.1 | 2.3 | 2 | 0.38 |
| 0.9 | 2.3 | 2.2 | 0.58 |
| 0.7 | 2.3 | 2.4 | 0.80 |
| 1.1 | 2.5 | 1.8 | 0.38 |
| 0.9 | 2.5 | 2 | 0.58 |
| 0.7 | 2.5 | 2.2 | 0.80 |
| 0.5 | 2.5 | 2.4 | 1.03 |
| 1.1 | 2.7 | 1.6 | 0.38 |
| 0.9 | 2.7 | 1.8 | 0.58 |
| 0.7 | 2.7 | 2 | 0.80 |
| 0.5 | 2.7 | 2.2 | 1.03 |
| 0.3 | 2.7 | 2.4 | 1.20 |
| 1.1 | 2.9 | 1.4 | 0.38 |
| 0.9 | 2.9 | 1.6 | 0.58 |
| 0.7 | 2.9 | 1.8 | 0.80 |
| 0.5 | 2.9 | 2 | 1.03 |
| 0.3 | 2.9 | 2.2 | 1.20 |
| 0.1 | 2.9 | 2.4 | 1.22 |
| 1.1 | 3.1 | 1.2 | 0.38 |
| 0.9 | 3.1 | 1.4 | 0.58 |
| 0.7 | 3.1 | 1.6 | 0.80 |
| 0.5 | 3.1 | 1.8 | 1.03 |
| 0.3 | 3.1 | 2 | 1.20 |
| 0.1 | 3.1 | 2.2 | 1.22 |
| −0.1 | 3.1 | 2.4 | 1.01 |
| 0.9 | 3.3 | 1.2 | 0.58 |
| 0.7 | 3.3 | 1.4 | 0.80 |
| 0.5 | 3.3 | 1.6 | 1.03 |
| 0.3 | 3.3 | 1.8 | 1.20 |
| 0.1 | 3.3 | 2 | 1.22 |
| −0.1 | 3.3 | 2.2 | 1.01 |
| −0.3 | 3.3 | 2.4 | 0.58 |
| 0.7 | 3.5 | 1.2 | 0.79 |
| 0.5 | 3.5 | 1.4 | 1.01 |
| 0.3 | 3.5 | 1.6 | 1.17 |
| 0.1 | 3.5 | 1.8 | 1.21 |
| −0.1 | 3.5 | 2 | 1.01 |
| −0.3 | 3.5 | 2.2 | 0.58 |
| −0.5 | 3.5 | 2.4 | 0.00 |
| 0.5 | 3.7 | 1.2 | 0.86 |
| 0.3 | 3.7 | 1.4 | 1.00 |
| 0.1 | 3.7 | 1.6 | 1.05 |
| −0.1 | 3.7 | 1.8 | 0.96 |
| −0.3 | 3.7 | 2 | 0.58 |
| −0.5 | 3.7 | 2.2 | 0.00 |
| 0.3 | 3.9 | 1.2 | 0.98 |
| 0.1 | 3.9 | 1.4 | 1.03 |
| −0.1 | 3.9 | 1.6 | 0.88 |
| −0.3 | 3.9 | 1.8 | 0.57 |
| −0.5 | 3.9 | 2 | 0.00 |
| 0.1 | 4.1 | 1.2 | 1.03 |
| −0.1 | 4.1 | 1.4 | 0.88 |
| −0.5 | 4.1 | 1.8 | 0.00 |

Table 4 summarizes the lower and upper limits of VBO and $E_g$ that lead to enhancement factors greater than 1 for the cells with absorber layer thickness of 3.5 microns.

TABLE 4

Selected ranges for values for VBO and $E_g$

| Se Profile | Constant Se | | Top Hat Se | |
|---|---|---|---|---|
| Metal WF (eV) | 4.9 | 5.4 | 4.9 | 5.4 |
| VBO lower limit (eV) | −0.1 | −0.1 | 0.1 | 0.5 |
| VBO upper limit (eV) | 0.5 | 0.3 | >1.3 | >1.3 |
| $E_g$ lower limit (eV) | 1.2 | 1.4 | 1.2 | 1.4 |
| $E_g$ upper limit (eV) | >2.4 | >2.4 | >2.4 | >2.4 |

The effect of absorber thickness was simulated by reducing the overall absorber layer thickness from 3.5 microns to 2 microns in the simulations. Two different Se concentration profiles were considered: a constant profile and a top-hat profile. For the constant profile, a Se concentration profile with x=0.4 was assumed throughout the absorbing layer of the device. In the top-hat profile, x=0 from the back of the device until about 0.5 microns from the front interface, whereupon it rises. From this point, x=0.4 until the front of the absorber layer is reached. The total absorber layer thickness of the top hat and constant Se profile devices is the same. The enhancement factor was calculated by calculating the ratio of the calculated efficiency of the device with the electron blocking layer to the device with the same contact work function and Se profile without the electron blocking layer, but with an additional 0.1 micron of absorber layer thickness. Approximately 50-75 simulations for different VBO and $E_g$ values were calculated for each profile (constant and top-hat) and metal contact work function considered (4.9 eV and 5.3 eV). For each simulation condition the enhancement factor due to the electron blocking layer was calculated.

Table 5 summarizes the lower and upper limits of VBO and $E_g$ that lead to enhancement factors greater than 1 for the cells with absorber layer thickness of 2 microns. Tables 4 and 5 summarize the lower and upper limits of VBO and $E_g$. From the data in Tables 4 and 45, the lower limit of VBO appears to be about −0.1 eV with a preferred region of above 0 eV. The upper limit for the value of VBO from the simulations appears to be above 1.3 eV in some cases. The lower boundary for $E_g$ appears to be about 1.1 eV, with no upper bound for the value of $E_g$. However, in practice, the upper limit of the $E_g$ is limited by the fact that materials with very high values of $E_g$ (i.e. $E_g$>4 eV) tend to be low mobility insulators.

TABLE 5

Selected ranges for values for VBO and $E_g$ for 2 micron thick absorber layers

| Profile | Constant Se | | Top hat Se | |
|---|---|---|---|---|
| Metal WF (eV) | 4.9 | 5.4 | 4.9 | 5.4 |
| VBO lower bound (eV) | −0.2 | −0.2 | 0 | 0.2 |
| VBO upper bound (eV) | 0.8 | 0.4 | 0.6 | 0.2 |
| $E_g$ lower bound (eV) | 1.1 | 1.5 | 1.1 | 1.7 |
| $E_g$ upper bound (eV) | >2.3 | >2.3 | >2.3 | >2.3 |

In a manner analogous to the calculation of the valence band offset a conduction band offset (CBO) may be calculated via $$CBO = VBO + E_g - E_{g\_absorber\_layer}$$

where $E_{g\_absorber\_layer}$ is the energy gap of the absorber layer material directly adjacent to the electron blocking layer. Of the simulation cases used to construct the analysis reported in Tables 3 and 4, there were only two scenarios where a calculated CBO value that was negative lead to an enhancement factor greater than 1. There were two additional scenarios where the CBO was both equal to 0 and there was an enhancement factor greater than 1. In all four of these cases the enhancement factor was in the range from about 1.02 to about 1.03, and all four cases were with the combination of the top-hat profile with the metal contact WF of 4.9 eV.

To illustrate the benefits of the electron blocking layer (EBL), the efficiency of the reference structures with no electron blocking layer (EBL) are compared to analogous structures with an optimized electron blocking layer. The values for the VBO and $E_g$ for each of these optimal layers is reported in Table 6. In the case where equivalent results were obtained for electron blocking layers with different values of $E_g$, the lowest $E_g$ value is reported. From this table the minimum value of VBO is about 0.1 eV and the value of $E_g$ ranges between 1.6 eV and 2 eV. The value of the CBO was positive in all cases.

TABLE 6

Selected ranges for values for VBO and $E_g$ for 2 micron thick and 3.5 micron thick absorber layers, with or without electron blocking layer

| Se Profile | Work function | Electron Blocking layer | Relative efficiency | VBO | $E_g$ | Absorber Thickness |
|---|---|---|---|---|---|---|
| No Se | 5.0 | No | 1.00 | — | — | 3.6 |
| Constant | 4.9 | No | 0.96 | — | — | 3.6 |
| Constant | 5.4 | No | 1.20 | — | — | 3.6 |
| Top hat | 4.9 | No | 1.02 | — | — | 3.6 |
| Top hat | 5.4 | No | 1.22 | — | — | 3.6 |
| Constant | 4.9 | No | 0.77 | — | — | 2.1 |
| Constant | 5.4 | No | 1.25 | — | — | 2.1 |
| Top hat | 4.9 | No | 0.97 | — | — | 2.1 |
| Top hat | 5.4 | No | 1.27 | — | — | 2.1 |
| Constant | 4.9 | Yes | 1.26 | 0.20 | 1.90 | 3.5 |
| Constant | 5.4 | Yes | 1.26 | 0.30 | 1.60 | 3.5 |
| Top hat | 4.9 | Yes | 1.25 | 0.1 | 2 | 3.5 |
| Top hat | 5.4 | Yes | 1.26 | 0.9 | 1.8 | 3.5 |
| Constant | 4.9 | Yes | 1.35 | 0.2 | 1.9 | 2 |
| Constant | 5.4 | Yes | 1.35 | 0.2 | 1.7 | 2 |
| Top hat | 4.9 | Yes | 1.31 | 0.20 | 1.90 | 2 |
| Top hat | 5.4 | Yes | 1.31 | 0.20 | 1.90 | 2 |

Figure 9:
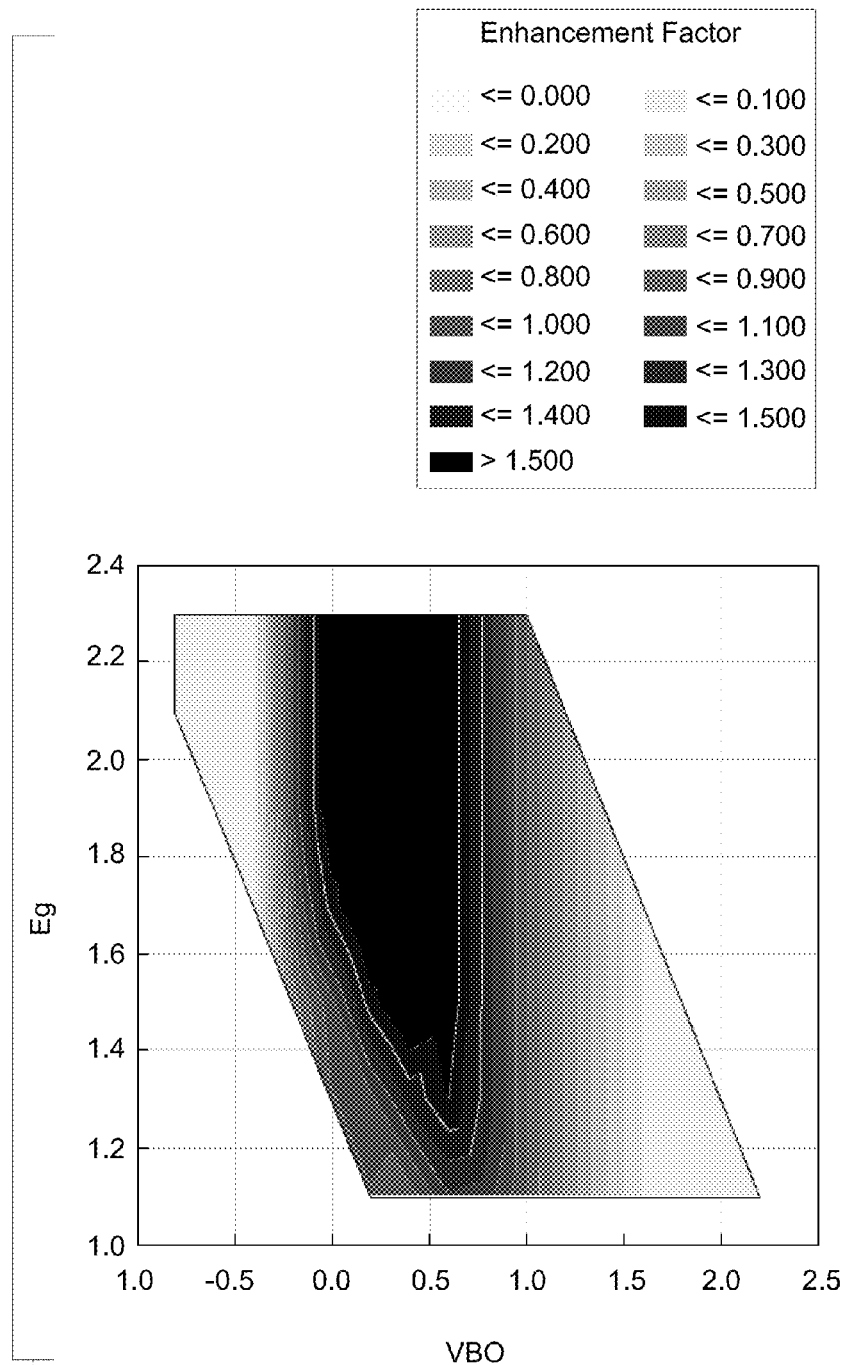
FIG. 9 is a contour plot showing calculated enhancement factor versus VBO and $E_g$ for a photovoltaic device, according to some embodiments of the invention.

FIG. 9 shows the contour plot for the calculated enhancement factor versus VBO and $E_g$ for a constant x=0.4 Se profile in an absorber layer of 2.0 microns thickness, and with a back contact WF of 4.9 eV.

The appended claims are intended to claim the invention as broadly as it has been conceived and the examples herein presented are illustrative of selected embodiments from a manifold of all possible embodiments. Accordingly, it is the Applicants' intention that the appended claims are not to be limited by the choice of examples utilized to illustrate features of the present invention. As used in the claims, the word "comprises" and its grammatical variants logically also subtend and include phrases of varying and differing extent such as for example, but not limited thereto, "consisting essentially of" and "consisting of." Where necessary, ranges have been supplied; those ranges are inclusive of all sub-ranges there between. It is to be expected that variations in these ranges will suggest themselves to a practitioner having ordinary skill in the art and where not already dedicated to the public, those variations should where possible be construed to be covered by the appended claims. It is also anticipated that advances in science and technology will make equivalents and substitutions possible that are not now contemplated by reason of the imprecision of language and these variations should also be construed where possible to be covered by the appended claims.

The invention claimed is:

1. A photovoltaic device, comprising:
a layer stack, wherein the layer stack comprises a plurality of transparent layers;
an absorber layer comprising cadmium, tellurium, and selenium disposed on the layer stack; and
a semiconductor layer disposed on the absorber layer, wherein a valence band offset between the semiconductor layer and the absorber layer is less than about 1.3 electron Volts, and a band gap of the semiconductor layer is in a range from about 1.2 electron Volts to about 3.5 electron Volts;
wherein the absorber layer is between the layer stack and the semiconductor layer;
wherein the semiconductor layer has an offset in conduction band energy level relative to that of the absorber layer; and
wherein the semiconductor layer comprises $Cd_xM_{1-x}Te$, wherein x is a number in a range from 0 to 1, Cd is cadmium, Te is tellurium, and M comprises a divalent metal.

2. The photovoltaic device of claim 1, wherein an atomic concentration of selenium is substantially constant across a thickness of the absorber layer.

3. The photovoltaic device of claim 1, wherein an atomic concentration of selenium varies across a thickness of the absorber layer.

4. The photovoltaic device of claim 1, wherein an atomic concentration of selenium varies non-linearly across a thickness of the absorber layer.

5. The photovoltaic device of claim 1, wherein the absorber layer further comprises sulfur, oxygen, copper, chlorine, or combinations thereof.

6. The photovoltaic device of claim 1, wherein the absorber layer comprises a first region and a second region, the first region disposed proximate to the layer stack relative to the second region, and
wherein an average atomic concentration of selenium in the first region is greater than an average atomic concentration of selenium in the second region.

7. The photovoltaic device of claim 1, wherein the absorber layer comprises a first region and a second region, the first region disposed proximate to the layer stack relative to the second region, and
wherein an average atomic concentration of selenium in the first region is lower than an average atomic concentration of selenium in the second region.

8. The photovoltaic device of claim 6, wherein the second region comprises cadmium telluride.

9. The photovoltaic device of claim 1, wherein x is 0.

10. The photovoltaic device of claim 1, wherein M comprises manganese, magnesium, zinc, or combinations thereof.

11. The photovoltaic device of claim 1, wherein the semiconductor layer comprises zinc telluride, cadmium manganese telluride, or combinations thereof.

12. The photovoltaic device of claim 1, wherein the semiconductor layer is p-doped.

13. The photovoltaic device of claim 1, wherein the semiconductor layer is substantially intrinsic.

14. The photovoltaic device of claim 1, wherein a valence band offset between the semiconductor layer and the absorber layer is in a range from about 0 electron Volts to about 0.45 electron Volts.

15. The photovoltaic device of claim 1, wherein a band gap of the semiconductor layer is in a range from about 1.6 electron Volts to about 2.7 electron Volts.

16. The photovoltaic device of claim 1, wherein the layer stack comprises:
a transparent conductive layer disposed on a support; and
a buffer layer disposed between the transparent conductive layer and the absorber layer.

17. The photovoltaic device of claim 16, wherein the layer stack further comprises an interlayer disposed between the buffer layer and the absorber layer.

18. The photovoltaic device of claim 16, wherein the layer stack further comprises a window layer disposed between the buffer layer and the absorber layer.

19. The photovoltaic device of claim 18, wherein the window layer comprises cadmium sulfide, oxygenated cadmium sulfide, zinc sulfide, cadmium zinc sulfide, cadmium selenide, indium selenide, indium sulfide, or combinations thereof.

20. The photovoltaic device of claim 1, wherein the device is substantially free of a cadmium sulfide layer.

21. The photovoltaic device of claim 1, further comprising a back contact layer disposed on the semiconductor layer, wherein the back contact layer comprises a metal, copper-doped elemental tellurium, graphite, or combinations thereof.

22. A photovoltaic device, comprising:
a layer stack, wherein the layer stack comprises a plurality of transparent layers;
an absorber layer comprising $CdSe_zTe_{1-z}$ disposed on the layer stack, wherein "z" is a number in a range from about 0 to about 1; and
a semiconductor layer disposed directly in contact with the absorber layer, wherein a valence band offset between the absorber layer and the semiconductor layer is less than about 1.3 electron Volts, and a band gap of the semiconductor layer is in a range from about 1.6 electron Volts to about 2.7 electron Volts;
wherein the absorber layer is between the layer stack and the semiconductor layer; and
wherein the semiconductor layer has an offset in conduction band energy level relative to that of the absorber layer.

23. A photovoltaic device, comprising:
a layer stack, wherein the layer stack comprises a plurality of transparent layers;
an absorber layer comprising selenium disposed on the layer stack, wherein a concentration of selenium varies across a thickness of the absorber layer;
a semiconductor layer disposed directly in contact with the absorber layer, wherein a valence band offset between the absorber layer and the semiconductor layer is less than about 0.45 electron Volts, and a band gap of the semiconductor layer is in a range from about 1.6 electron Volts to about 2.7 electron Volts; and
an interfacial layer interposed between the absorber layer and the semiconductor layer;
wherein the absorber layer is between the layer stack and the semiconductor layer.

24. The photovoltaic device of claim 1, further comprising an interfacial layer interposed between the absorber layer and the semiconductor layer.

* * * * *